United States Patent [19]

Sauerwald et al.

[11] Patent Number: 5,430,735
[45] Date of Patent: Jul. 4, 1995

[54] TESTING INTEGRATED CIRCUITS PROVIDED ON A CARRIER

[75] Inventors: Wilhelm A. Sauerwald; Franciscus G. M. De Jong, both of Eindhoven, Netherlands

[73] Assignee: U.S. Philips Corporation, New York, N.Y.

[21] Appl. No.: 420,612

[22] Filed: Oct. 10, 1989

Related U.S. Application Data

[63] Continuation of Ser. No. 90,489, Aug. 28, 1987, abandoned.

[30] Foreign Application Priority Data

Sep. 10, 1986 [NL] Netherlands .................. 8602274

[51] Int. Cl.$^6$ ............................................. G01R 31/28
[52] U.S. Cl. ..................................... 371/22.3; 371/22.5
[58] Field of Search .............................. 371/22.3, 22.5

[56] References Cited

U.S. PATENT DOCUMENTS

| | | | |
|---|---|---|---|
| 3,761,695 | 9/1973 | Eichelberger | 235/153 |
| 4,357,703 | 11/1982 | Van Brunt | 371/22.5 |
| 4,701,920 | 10/1987 | Resnick et al. | 371/22.5 |
| 4,710,927 | 12/1987 | Miller | 371/22.1 |
| 4,710,933 | 12/1987 | Powell et al. | 371/25.1 |
| 4,791,358 | 12/1988 | Sauerwald et al. | 324/73 R |
| 4,931,722 | 6/1990 | Stoica | 371/22.5 |

OTHER PUBLICATIONS

VHSIC Phase 2 Interoperability Standards ETM–Bus Specification, Dec. 31, 1985, Version 1.0; copyright 1985 IBM Honeywell TRW.
VHSIC Phase 2 Interoperability Standards ETM–Bus Specification, Aug. 31, 1986, Version 1.1, copyright 1985 IBM Honeywell TRW.
Avra, L., "A VHSIC ETM–Bus–Compatible Test and Maintenance Interface", 1987 Int'l. Test Conf., pp. 964–971.
Griffin, K., "VHSIC Phase 2 Test Requirements for the Depot", AUTOTESTCON 1989, pp. 289–294.
Mendelsohn, A., "Self-Testing ICs Begin to Emerge-Tentatively", *Electronics*, Feb. 24, 1986, pp. 33–36.
Anon., "Checking Out VLSI with Standard Test Gear", *Electronics*, May 26, 1986, pp. 33–35.
Sideris, "Special Report: The Drive for IC Test–Bus Standards", Electronics, Jun. 11, 1987, pp. 68–71.
Search by DTIC for documents on VHSIC.

*Primary Examiner*—Stephen M. Baker
*Attorney, Agent, or Firm*—Anne E. Barschall

[57] ABSTRACT

A method for testing integrated circuits provided on a carrier. The circuits include a series input (22) and a series output (24) for test and result patterns. A mode control register (30) receives a mode control signal train via the serial input. Under the control of said mode control signal train the serial input and output can be shortcircuited to each other, or further registers (32, 34, 36) can be selectively filled and emptied. In this manner, both the interior of the integrated circuit and respective interconnection functions can easily be tested by a universal protocol. Integrated circuits and the carrier only require minor extension/adaptations.

30 Claims, 3 Drawing Sheets

TESTING INTEGRATED CIRCUITS PROVIDED ON A CARRIER

This is a continuation of application Ser. No. 07/090,489, filed Aug. 28, 1987, now abandoned.

BACKGROUND OF THE INVENTION

The invention relates to a method of testing integrated circuits provided on a carrier. In the method, a test pattern is presented serially to an integrated circuit set to an input state, by means of a first connection of the integrated circuits. The test pattern is stored temporarily. The integrated circuits are set to an execution state to form a result pattern from the test pattern. The result pattern present in any of the integrated circuits set to an output state is then serially removed by means of a second connection of the integrated circuits to provide, by means of an evaluation on the information contents thereof, a characterization of a correct/incorrect operation of the integrated circuits and their interconnection function, respectively. An example of such carriers comprises printed circuit boards, but the invention is not restricted to the interconnection technology. With integrated circuits becoming more and more complex, the need for a reliable test method increases because rejection of a product in an earlier phase of production is usually much less expensive than rejection in a later production phase. An integrated circuit can be tested exhaustively before being mounted on such a carrier so that the possibility of an undetected defect in such an integrated circuit is negligibly small. Nevertheless, testing of the carrier with mounted circuits in a structure test proves to be useful because an integrated circuit may be damaged during mounting and because an interconnection function may be defective.

The interconnection function between two (or more) integrated circuits is to be understood to mean the operational behaviour and hence implicitly the correct/incorrect structure of the following elements or a part thereof, for example:

a. the conductor pattern provided on the carrier: test for interruption and/or short circuit;
b. the connection between said conductors and the connection pins of the integrated circuit modules:
c. the connection between said connection pins and the bonding flaps provided on the substrate of the integrated circuit, for example by means of a bonding wire;
d. optionally present buffer elements between the bonding flap and the input/output for the relevant bit of test/result pattern;
e. optional further elements provided between the integrated circuits thus connected, at least as far as their digital functioning is concerned. They may be passive elements, for example a terminating resistor which couples an interconnection junction to earth. Alternatively, they may be an integrated circuit which in itself cannot be tested, for example a module constructed in conventional TTL logic, for example a latch circuit.

Example of a known technique:

It is known to test a combination of integrated circuits according to the scan-test principle as described, for example, in U.S. Pat. No. 3,761,695 in which the various integrated circuits are tested successively. The scan-test principle is based on the fact that in the input and output conditions a number of bistable elements present in the integrated circuit are connected as shift registers so that the test and result patterns, respectively, can be inputted and outputted serially to form said shift registers. In the execution condition said bistable elements are used in a manner as if the circuit were in normal use. The principle stated in said patent specification may be expanded to the "serpentine" concept. The serpentine concept involves that the integrated circuits are connected into a chain. The test patterns and result patterns can move on said chain in that an output line for result patterns of a circuit of the chain also operates as an input line for test patterns of a subsequent circuit of the chain. As a result of the cascade connection of the integrated circuits, the test/result patterns must often traverse several integrated circuits before they arrive at a given location. When several test/result patterns are used simultaneously they must further be spaced at the correct distance along the serpentine connection thus formed to be inputted correctly and evaluated correctly. As a result of this, testing takes a long time and requires continuous supervision by a testing device so that the latter cannot direct its processing capacity alternately to the presentation of a test pattern and the evaluation of a previously received result pattern.

A further disadvantage of the serpentine concept described is that in the case of dysfunction of one of the circuits it is in many cases not possible to test the other integrated circuits if test and/or result patterns are mutilated by the serial transport. Furthermore, all the integrated circuits thus present must be mutually operated synchronously and they must all have the relevant test facility. All this considerably reduces the applicability of this concept.

The above problem also applies when the interconnection function between two or more integrated circuits is tested. In this test, test patterns are applied to one or more integrated circuits, communicated via the interconnection function, and result patterns are removed from one or more integrated circuits (the same or other ones). The test pattern is applied to an output register, while the result pattern is removed from an input register of commonly another integrated circuit. For an internal test on the integrated circuit the test pattern is commonly applied to an input register, while the result pattern is commonly removed from an output register of the same integrated circuit. Selected objects of the invention.

It is an object of the invention to provide a method in which a defective circuit arrangement or defective interconnection function need not usually impede the testing of other integrated circuits or interconnection functions on the same carrier because it can be arranged that all the integrated circuits, and interconnection functions except the integrated circuit or interconnection function under test, are usually substantially short-circuited. It is an object, furthermore, to provide a method in which control of the respective integrated circuits can be realized at two levels, as a result of which control of individual test modes easy to realize, and in which furthermore, by a standardization of the connections, an environment can be created in which an arbitrary circuit or interconnection function can be made testable without additional connections for information or control being necessary.

The connection technique can be simple so that inter alia little area of the carrier need be occupied: arbitrary addressability of the integrated circuits can be realized, the methodology can be applied to the above test procedures; and per integrated circuit function variations and additions may be possible without it being necessary for the interface to be changed for testing.

SUMMARY OF THE INVENTION

According to the invention a method as set forth in the background of the invention is characterized in that, prior to activating the said input state, the integrated circuits are set to an initiator state. In the initiator state, a mode control signal train is applied to a third connection and is stored in at least one of the integrated circuits in a mode control register. The method according to the invention is further characterized in that a first content of the mode register then provides, as a first alternative, a first control signal to short circuit the third connection of the relevant integrated circuit directly to a fourth connection to directly couple information received on the third connection into a further connection of another integrated circuit which further connection corresponds to the third connection and is connected to the said fourth connection. The method according to the invention is further characterized in that a second content of the mode register, as a second alternative, provides a second control signal to throughconnect the third connection, while bypassing the said mode register, to an input register to apply thereto local test pattern signals, and to couple the fourth connection, while bypassing the said mode control register, to an output register to derive local result pattern signals therefrom so that the said third and fourth connections then operate as the said first and second connections, respectively. As a result of the easily adjustable mode control, many different modes can be realized, if necessary. As a result of the short circuit, tests, of other integrated circuits and interconnection functions present for other integrated circuits, also with considerable defects, can usually be carried out.

In the second mode the test pattern may be used both for a test of the interior of an integrated circuit and for a test of an interconnection function.

The invention also relates both to a carrier provided with a number of integrated circuits which can easily be tested by means of the method and to an integrated circuit which is suitable for being provided on such a carrier after which the integrated circuit and/or the interconnection functions can be tested. Further advantageous realizations are claimed in the sub-claims.

BRIEF DESCRIPTION OF THE FIGURES

The invention will be described in greater detail, by way of example, with reference to the accompanying diagrammatic drawings in which.

DETAILED DESCRIPTION OF THE PREFERRED EMBODIMENTS

Description of an integrated circuit.

Figure 1:
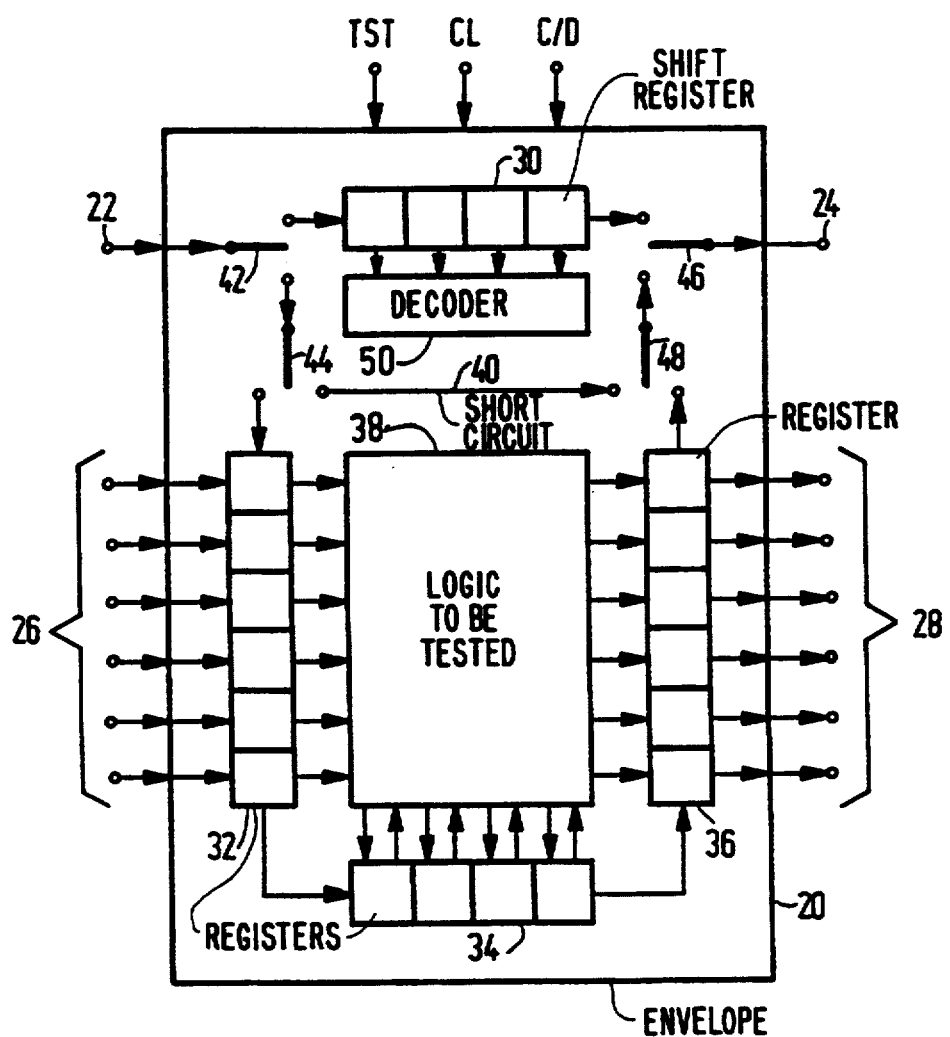
FIG. 1 is a block diagram of an integrated circuit embodying the principle of the invention.

FIG. 1 is a block diagram of an integrated circuit embodying the principle of the invention. The envelope is denoted by the block 20. The circuit comprises four registers 30, 32, 34, 36. The shift register 30 is fed via switch 42 by input 22 to receive a mode control signal train; in this simple embodiment it accommodates four bits. The storage thereof is synchronized by clock pulses at terminal CL and is done under the control of a first control signal at terminal TST which indicates that a serial pattern is received and a second control signal at terminal C/D which sets the switch 42 in the top position and thus signals that the mode control signal train can be received. In the non-test position the registers 32, 34, 36 are transparent and not noticeable to the outside world.

The actual user function of the circuit is fulfilled by the bistable elements of register 34 (in this example also four) and the block 38 which in this case comprises combinational logic not further specified (and optionally further elements). The bistable elements of register 34 operate by their bidirectional coupling with block 38 as internal flipflops of said block. In the input/output states register 34 is operated in the usual scan-test manner to communicate a test/result pattern from to the outside world. In another realization it operates to store information with which internal flipflops can be preset to a relevant value. In that case the actual function of the integrated circuit is fulfilled entirely by block 38. The flipflops of register 34 and the flipflops which are set thereby may be situated at any position within the block 38. For simplicity the user function is not further specified. It is also possible that the internal scan test is not implemented, but that the output of register 32 is directly connected to the input of register 36.

Register 32 in this example comprises six stages which can be filled in parallel via input 26. It can furthermore be filled serially via input 22 and the switches 42 and 44 provided these are in the appropriate positions. The register 32 has a serial output to register 34. The register 32 has a parallel output to the block (combinational) logic 38. For testing the interconnection function a result pattern is received in parallel and is removed serially. For testing block 38 a test pattern is received serially and is removed in parallel. It is not strictly necessary for these two provisions to be implemented.

Register 36 in this example comprises six stages which can be filled in parallel from the block (combinational) logic 38. It may furthermore be filled serially from register 34. The register 36 can provide its information serially to output 24 provided switches 46 and 48 are in the correct positions. The register 36 has a parallel output via the outputs 28. For testing the interconnection function a test pattern is received serially and is removed in parallel. For testing block 38 a result pattern is received in parallel and is removed serially. It is not strictly necessary for the two provisions to be also implemented.

The shift register 30 has a serial output to output 24 provided switch 46 is in the appropriate position. In certain cases this latter connection is superfluous and register 30 has no serial output. Furthermore, a logic short circuit 40 which is active when the four switches 42, 44, 46, 48 are all in the appropriate positions is present between serial input 23 and serial output 24. Optionally, said logic short circuit comprises a clocked buffer 401 as a result of which time delay effects can be standardized and there is no definition problem when a (large) number of these short circuits are connected in series. Finally the integrated circuit comprises a decoder 50 which is connected to (a part of) shift register 30. Decoder 50 can decode certain bits or bit combinations in shift register 30 to then form a given internal control signal for the integrated circuit 20. In another embodiment the contents of shift register 30 have already been decoded entirely and decoder 50 is superfluous. The register 34 in this case present between the registers 32 and 36 may alternatively be situated in another position, for example between input 22 and register 32 or between register 36 and output 24. As shown, it may be single so that it can directly be filled serially. It may also be plural, for example in the form of a register bank or stack so that various test/result patterns can successively be stored therein and be retained collectively. It is also possible for the test patterns to have a fixed length, for example of (in this case) four bits, while internally a much longer test pattern is necessary. Multiple series-parallel conversion then takes place. The same applies to the result patterns. Addressing the register bank/stack can be done again by a suitable control signal from register 30/decoder 50. The operational modes.

The FIG. 1 circuit can operate in the following control modes:

Under the control of a determined signal at terminal C/D and the test control signal at terminal TST switch 42 is in the top position and register 30 is filled serially with a mode control train. In this example switch 46 is then also in the top position and the mode control train can also be transmitted to other integrated circuits which are connected to connection 24. It is advantageous for all mode control registers 30 of the respective integrated circuits provided on a carrier to have the same length. Upon filling, synchronization takes place by clock pulses at connection CL.

When the said signal is not present at terminal C/D, switches 42 and 46 are in the bottom position. This means that when no mode control signals are applied the operation of the circuit can be controlled by the contents of mode control register 30. These control modes may relate to the following:

Recognition of an address. The test mode to be described hereinafter is active only if a predetermined pattern is stored in certain bit positions of mode register 30. In all other cases the operational mode is active, in which only the intended user functions are carried out. This recognition takes place in decoder 50.

Setting switches 44, 48. The short circuit 40 is active if these are at the "inner" position so that a subsequent signal train applied to input 22 is directly removed at output 24. This means that a test pattern or result pattern can be coupled into another integrated circuit substantially without delay. When the switches 44, 48 are in the "outer" position and a "test" control signal is received at terminal TST a signal train at connection 22 is to be treated as a test pattern and may be used to fill the registers 32 and/or 34 and/or 36 serially with a suitable test pattern. The function of the respective test bits will be explained hereinafter. When after said supply the "test" control signal at terminal TST disappears, the test pattern is processed in the (combinational) logic circuit 38 as a result of which a result pattern appears in the registers 34 and/or 36, alternatively, the test pattern is transported via an interconnection function, after which the result of a test of the interconnection function appears in register 32. The result pattern of a test of an interconnection function will commonly appear in an integrated circuit other than that of which the test pattern for said test has been applied. If then the test control signal at terminal TST appears again (after one or a previously determined larger number of clock pulses at terminal CL) the test pattern can be removed for evaluation via connection 24. The input state and the output state are both synchronized by clock pulses at terminal CL. The execution state may optionally also be synchronized by clock pulses at terminal CL. This will often not occur, for example when hand-shake protocols are implemented between various integrated circuits (these could otherwise not be tested) and in general when the use of the serial shift clock would not be optimum, for example as a result of too low a frequency. In that case either an external clock or an internal clock will be provided.

Further modes which can be controlled selectively may be one or more of the following. Register 34 is short circuited by means of a couple of switches in the same manner as switches 44/46 realize a short circuit through line 40. The same may occur for the registers 32 and/or 36. It is also possible to directly short circuit the input 22 to the serial input of register 36. It is also possible to directly short circuit the serial output of register 32 to output 24. Furthermore a given internal control signal for the interior of block 38 may be realized.

Figure 2:
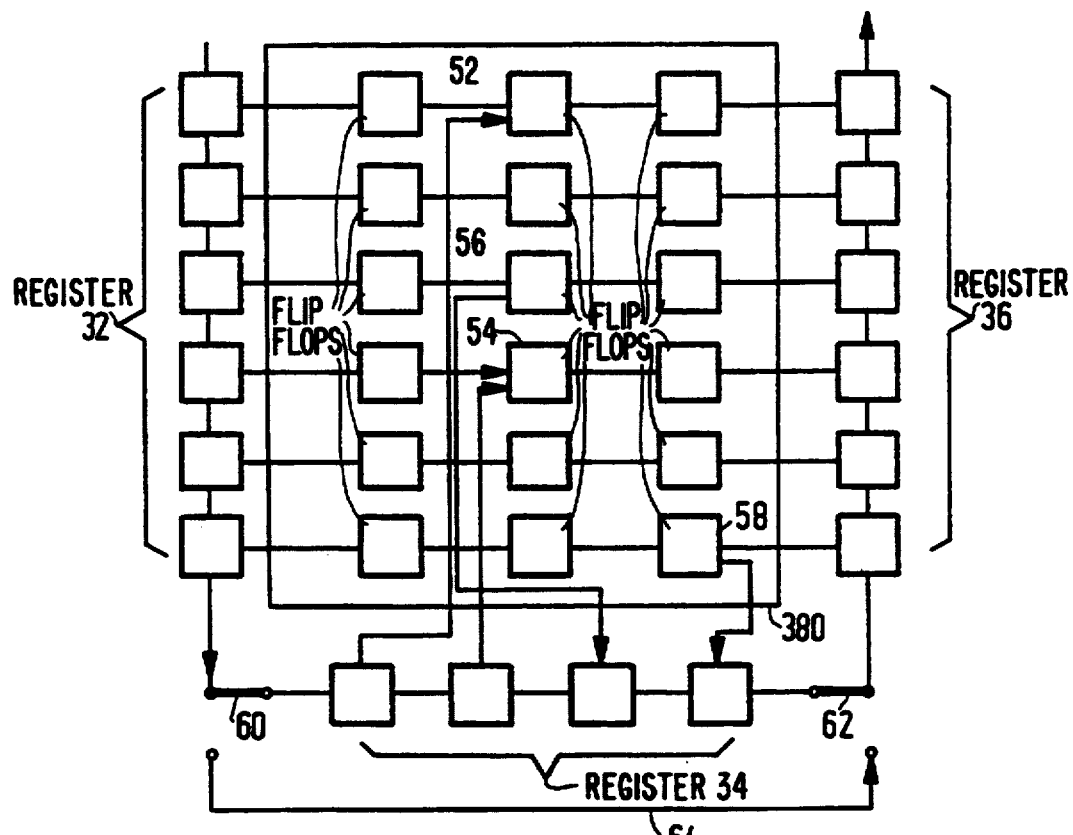
FIG. 2 shows a detail of the mutual relationship in a part of FIG. 1.

FIG. 2 shows another example of the organizational relationship between the registers 32, 34 and 36 and a block 380 which in this case also comprises a number of flipflops in addition to combinational logic (not shown). In the first place a selectively controllable shortcircuit for register 34 is realized by means of switches 60, 62 and line 64. The flipflops of register 32 contain a series of six information bits which can be received from outside the circuit (via connection 26). The flipflops of register 36 after a test of block 380 contain representations of six information bits to be applied to further elements. Alternatively they contain, before a test of an interconnection function, a test pattern to be applied to said interconnection function, which test pattern then can be received, for example, in another integrated circuit. In addition to the above it is possible that a number of the register stages of registers 32, 36 are connected bidirectionally to internal components of block 38/380.

FIG. 2 shows that the interior of block 380 also comprises a number of flipflops. They are indicated by blocks. The logic depth measured in bits is three bits for all the input stages of register 32 up to the output stages of register 36. The combinational logic may give rise to all kinds of transverse connections. In fact the functional circuit is divided into six parallel organized independently loadable scan test chains, for which purpose register 32 forms a series-to-parallel converter and register 36 forms a parallel-to-series converter. Conversely, for testing an interconnection function between integrated circuits on one carrier, register 36 may form a series/parallel converter and register 32 may form a parallel/series converter.

It is shown in FIG. 1 that register 34 is connected bit-wise bidirectionally to block 38. In FIG. 2 each individual bit position is connected unidirectionally to a respective previously determined internal flipflop within block 380. As a result of this, the contents of the bit positions 52, 54 in this example can be set to predetermined values. Furthermore, the information contents of bit positions 56, 58 can be derived in a corresponding selective manner without further interactions with later flipflops of the scan test chain. The advantage of such an operation is that in certain cases it will suffice to fill register 36 only once, even when the depth of the individual scan test chains within block 380 is (much) larger than 1 bit position.

The following modes are possible:

a. short circuit by means of connection 40;
b. the scan test is carried out with a test pattern of six bits wide and three bits deep, the dimension of the result pattern being the same. In practice such patterns will usually have considerably larger dimensions;
c. the register 32 is filled with a test pattern of six bits wide and one bit deep; a result pattern of the same dimension is formed in register 36, register 34 being not activated;
d. the same as c, but in this case register 34 is also activated;
e. only register 34 is activated, registers 32, 36 being short circuited (the advantage of this is that a pattern can then rapidly be applied via input 22 and be removed via output 24). All kinds of modes can be implemented, some of which are advantageous in particular for testing the integrated circuit itself, and some of which are advantageous in particular for testing the interconnection functions. Description of a carrier.

Figure 3:
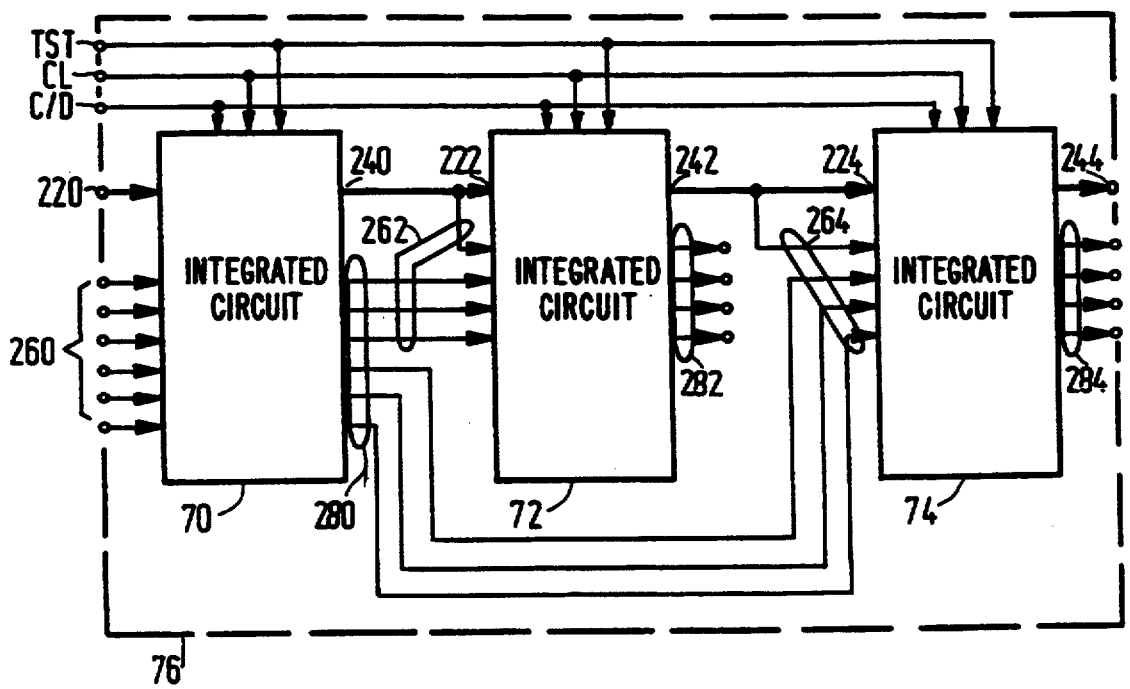
FIG. 3 shows an example of a carrier having several integrated circuits.
Figure 4:
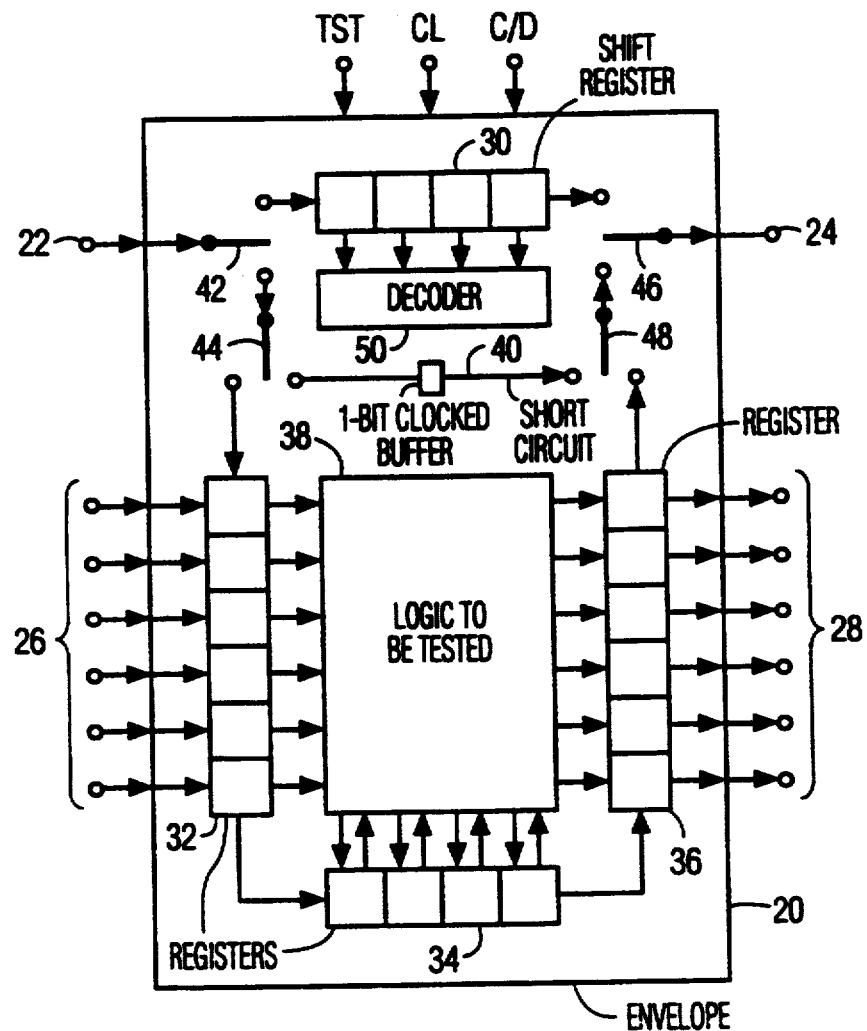
FIG. 4 shows an alternate embodiment of FIG. 1.

FIG. 3 shows a carrier having three integrated circuits to which the invention can be applied. Integrated circuit 70 looks to the exterior like the FIG. 1 circuit: three control connections TST, CL, C/D, six pins at 260 on the input side, six pins at 280 on the output side. Furthermore there is an input 220 and an output 240 for a mode control signal train. The integrated circuits 72, 74 are shown in a corresponding manner but individually they may have quite different functions. In the Figure it is shown only that they each have only four pins on the input side and the same number of pins on the output side. The connections 220, 222, 224 correspond to each other, as do the connections 240, 242 and 244. Connections 240 and 222 are interconnected. So when in the circuit 70 the short circuit around the mode control register is activated, a mode control signal train can be directly applied to the integrated circuit 72. The same also applies when said signal train is a test pattern or, if applicable, a result pattern. The connections 242 and 224 are also interconnected; the three integrated circuits thus are arranged in a daisy chain, but as a result of the short-circuitability of the various components the signal traverse nevertheless is rapid. (Optionally the delay is one clock pulse if a clocked buffer 401 is present per integrated circuit, which is shown in FIG. 4).

Connection 280 comprises six pins, whereas the connections 262, 264 each comprise only four pins. The interconnection patterns are determined in the first place by the functions which the carrier provided with integrated circuits has to fulfill. If no mode control signal train is present, nor a serial test pattern which has to be presented to a corresponding serial input (22 in FIG. 1), the output 240 will temporarily not be used. Therefore it is possible in such a case to involve said pin in the functional connection pattern of the carrier provided with integrated circuits. The relevant information signal may then be derived directly from terminal 220.

What is claimed is:

1. A method for testing one or more of a plurality of integrated circuits, at least two of the integrated circuits having respective first and second connections, the integrated circuits being disposed on a carrier, the method comprising the steps of:
   a) setting the integrated circuits to an initiator state;
   b) applying information signals including a mode control signal train to the respective first connection of at least one of the at least two integrated circuits when the integrated circuits are in the initiator state, said at least one of the integrated circuits being referred to herein as the relevant integrated circuit;
   c) storing at least a respective part of the mode control signal train in a respective mode control register of each relevant integrated circuit, each relevant integrated circuit including a respective mode control register;
   d) alternatively performing the following first and second sets of steps, according to contents of the respective mode control register:
   i) first set of steps:
      A) providing a first control signal from the respective mode control register of the relevant integrated circuit; and
      B) short-circuiting a succeeding portion of said information signals from the respective first connection of the relevant integrated circuit to the respective second connection of the relevant integrated circuit, said short-circuiting avoiding any local input and output registers; and
      C) directly connecting the succeeding portion from the respective second connection of the relevant integrated circuit to the respective first connection of another of said at least one of the integrated circuits, whereby the succeeding portion effectively bypasses a first integrated circuit and moves to a second integrated circuit;
   ii) second set of steps:
      A) providing a second control signal from the respective mode control register of the relevant integrated circuit;
      B) through-connecting the respective first connection of the relevant integrated circuit to a respective local input register of the relevant integrated circuit;
      C) applying, to the respective input register of the relevant integrated circuit, local test pattern signals;
      D) coupling the respective second connection of the relevant integrated circuit to a respective local output register of the relevant integrated circuit, so that the respective mode control register of the relevant integrated circuit is bypassed;
      E) deriving local result patterns from the relevant integrated circuit;
      F) serially removing the local result patterns, so that an evaluation of the local result patterns provides a characterization of correct/incorrect operation of the relevant integrated circuits and its connections.

2. The method of claim 1 wherein said short-circuiting step is a logical short-circuiting which comprises routing said succeeding portion along a data path producing a known delay which is substantially less than a delay which would be incurred by transmitting said succeeding portion through the mode control register, whereby bypassing entails a standardized delay.

3. The apparatus of claim 1 wherein said short-circuiting involves a one bit delay, whereby bypassing entails a standardized delay.

4. A testable carrier comprising
I. a serial data input;
II. a serial data output;
III. a sequence of integrated circuits each respective integrated circuit having
  a) a respective test data input and a respective test data output, the test data output of any predecessor integrated circuit in the sequence being connected to the test data input of that predecessor integrated circuit's next successor integrated circuit in the sequence, a test data input of a first integrated circuit in the sequence being coupled with the serial data input and a test data output of a last integrated circuit in the sequence being connected to the serial data output;
  b) a respective mode control register, and
  c) respective switch means, for,
    i) under control of a communal test control signal, interconnecting the respective integrated circuit's test input and test output to the respective integrated circuit's mode control register, producing a mode control register chain which avoids any test scan chains; and
    ii) under control of a second communal test control signal and the respective mode control register's content, connecting the integrated circuits into a test configuration such that, within each integrated circuit, either a bypass or a test register is interconnected between the respective test data input and output and such that the integrated circuits are connected to each other in a test chain via the respective test data inputs and outputs, whereby selected ones of the integrated circuits and connections between the integrated circuits are testable and other circuits and other non-selected ones of the integrated circuits and interconnections between the integrated circuits are bypassed; and
  d) execution means for under control of a third communal test control signal running an execution mode for, on the basis of a test pattern presented to said test data input, producing a result pattern at said result data output.

5. The apparatus of claim 4 wherein said connections between the integrated circuits comprise a parallel multibit information path between two integrated circuits which are not directly connected via their respective test data inputs and outputs.

6. The apparatus of claim 4 wherein the bypass delay is one bit, whereby bypassing entails a standardized delay.

7. The apparatus of claim 4 wherein said test pattern is presented to at least one of the integrated circuits in a serial to parallel conversion mode.

8. The apparatus of claim 4 wherein said result pattern is removed from at least one of said integrated circuits in a parallel to serial conversion mode.

9. The apparatus of claim 4, wherein
all said mode control registers have a same length, for storing a mode control signal train having the same length.

10. The apparatus of claim 9,
the mode control registers each receive, from the respective test data inputs, a respective mode control signal train.

11. Apparatus for testing an integrated circuit, the apparatus comprising:
  a) input means for receiving data;
  b) output means;
  c) register means for storing a test portion of the data;
  d) bypass means having an effective delay which is substantially less than a serial shift delay through the register means, which bypass means is disposed in parallel with the register means;
  e) connection means which assumes one of two states:
    i) a first state in which the connection means transmits the data from the input means to the register means and transmits signals from the register means to the output means; or
    ii) a second state in which the connection means transmits the data from the input means to the bypass means and from the bypass means to the output means;
  further comprising a second register means for storing control data and disposed in parallel with the register means and the bypass means; and
  wherein the connection means assumes one of three states: the first state, the second state, or a third state in which the connection means transmits the data from the input means to the second register means and from the second register means to the output means.

12. An integrated circuit comprising the apparatus of claim 11.

13. A carrier comprising a plurality of integrated circuits as claimed in claim 12, which integrated circuits are arranged in a chain, in which chain the output means of one integrated circuit is coupled with the input means of a next integrated circuit, and wherein in said second state, the bypass means functions to route data from the input means of the one integrated circuit to the output means of the one integrated circuit and thereby to the input means of the next integrated circuit.

14. The apparatus of claim 11 wherein the bypass means effects a one bit delay, whereby bypassing entails a standardized delay.

15. An integrated circuit comprising the apparatus of claim 14.

16. A carrier comprising a plurality of integrated circuits as claimed in claim 15, which integrated circuits are arranged in a chain, in which chain the output means of one integrated circuit is coupled with the input means of a next integrated circuit, and wherein in said second state, the bypass means functions to route data from the input means of the one integrated circuit to the output means of the one integrated circuit and thereby to the input means of the next integrated circuit.

17. The apparatus of claim 11 wherein the register means comprises
  a) a serial input for receiving data from the input means;
  b) a plurality of shift register stages, wherein
    i) at least two shift register stages have respective inputs in parallel for receiving data from another integrated circuit;
    ii) at least two shift register stages have respective outputs in parallel for supplying data to another integrated circuit; and
    iii) each shift register stage has either an input to, an output from, or a two-way connection with a respective lead of the integrated circuit; and
  c) a serial output for supplying data to the output means.

18. An integrated circuit comprising the apparatus of claim 17.

19. A carrier comprising a plurality of integrated circuits as claimed in claim 18,
  a) which integrated circuits are arranged in a chain, in which
    i) the output means of one integrated circuit is coupled with the the input means of a next integrated circuit;
    ii) the outputs in parallel of the one integrated circuit are coupled with the inputs in parallel of the next integrated circuit; and
  b) wherein in said second state, the bypass means functions to route data from the input means of the one integrated circuit to the output means of the one integrated circuit and thereby to the input means of the next integrated circuit.

20. A carrier comprising a plurality of integrated circuits as claimed in claim 18,
  a) which integrated circuits are arranged in a chain, in which
    i) the output means of one integrated circuit is coupled with the the input means of a next integrated circuit;
    ii) the outputs in parallel of the one integrated circuit are coupled with the inputs in parallel of an integrated circuit which is not the next integrated circuit; and
  b) wherein in said second state, the bypass means functions to route data from the input means of the one integrated circuit to the output means of the one integrated circuit and thereby to the input means of the next integrated circuit.

21. A boundary scan testable integrated circuit, comprising:
  a) a serial test input;
  b) a serial test output;
  c) a test clock input;
  d) at least one test control signal input;
  e) a mode control register, which, responsive to said test control signal, is connectable to said test input for receiving a multibit test control pattern,
  f) test control means responsive to said multibit test control pattern received;
  g) a bypass register that is short with respect to said mode control register;
  h) serial multibit scan register means interconnected within said integrated circuit to output in parallel a test pattern and to receive in parallel a result pattern, which mode control register, bypass register, and serial multibit scan register means are all disposed in parallel with respect to each other;
  i) first connection means fed by said serial test input for therefrom feeding an arbitrary amount of data under selective control by said test control means to either said bypass register or said scan register means; and
  j) second connection means feeding said serial test output for thereto in mirror operation with said first connection means feeding an arbitrary amount of data under selective control by said test control means from either said bypass register or said scan register means.

22. A carrier comprising a plurality of integrated circuits having the respective elements as claimed in claim 21 connected in a daisy chain via their respective serial test inputs and serial test outputs.

23. The carrier of claim 22 wherein, under control of the respective test control means of the integrated circuits, the respective first and connection means cause each of the integrated circuits to assume either
  a bypass mode in which the respective bypass register is connected between the respective serial input and the respective serial output; or
  a test mode in which the respective serial multibit scan register is connected to at least one of the respective serial input and the respective serial output.

24. A method for testing integrated circuits disposed on a carrier, the method comprising the following steps:
  a) serially connecting a plurality of mode control registers, a respective one for each integrated circuit, between respective serial inputs and outputs of the integrated circuits to form a mode control register chain which avoids any test scan chains;
  b) serially presenting a mode control signal train to a serial input of the carrier and thence to the mode control register chain, thereby loading the mode control registers with control information;
  c) under control of the control information loaded into the mode control registers, connecting the integrated circuits into a test configuration such that, within each integrated circuit, either a bypass or a test register is interconnected between the respective serial inputs and outputs and such that the integrated circuits are connected to each other in a test chain via the respective serial inputs and outputs, whereby selected ones of the integrated circuits and interconnections between the integrated circuits are testable and other non-selected ones of the integrated circuits and interconnections between the integrated circuits are bypassed;
  d) serially presenting test data to the serial input of the carrier and thence to the test configuration; and
  e) serially removing result data from a serial output of the carrier which is coupled to one of the serial outputs which is at an end of the test chain.

25. A method as claimed in claim 24, wherein there are further provided a plurality of mode control signal trains, which each have a uniform length for fitting in an appropriate mode control register of the same uniform length.

26. A method as claimed in claim 24, wherein the mode control signal train comprises the same number of mode control signal trains as the number of integrated circuits on said carrier.

27. A method as claimed in claim 24, wherein the bypass delay is one bit, whereby the bypassing entails a standardized delay.

28. A method as claimed in claim 24, wherein said test data is presented to at least one of said integrated circuits in a serial to parallel conversion mode.

29. A method as claimed in claim 24, wherein said result data is removed from at least one of said integrated circuits in a parallel to serial conversion mode.

30. A method as claimed in claim 24, wherein said connecting step is effected in response to a communal control signal to the integrated circuits.

* * * * *

UNITED STATES PATENT AND TRADEMARK OFFICE
CERTIFICATE OF CORRECTION

PATENT NO. : 5,430,735
DATED : July 4, 1995
INVENTOR(S) : Sauerwald, et. al.

It is certified that error appears in the above-indentified patent and that said Letters Patent is hereby corrected as shown below:

Column 9, line 62, after "9," insert --wherein--.

Signed and Sealed this

Second Day of July, 1996

Attest:

BRUCE LEHMAN

Attesting Officer     Commissioner of Patents and Trademarks